United States Patent [19]

Moriya et al.

[11] Patent Number: 4,581,308
[45] Date of Patent: Apr. 8, 1986

[54] PROCESS FOR PREPARATION OF A MASKING ELEMENT FOR FORMING A MULTICOLOR PRINTING PLATE

[75] Inventors: Takeo Moriya, Kawagoe; Yamagata Toshio, Urawa; Ogura Masako, Kawaguchi, all of Japan

[73] Assignee: Kimoto & Co., Ltd., Tokyo, Japan

[21] Appl. No.: 642,817

[22] Filed: Aug. 21, 1984

Related U.S. Application Data

[62] Division of Ser. No. 420,728, Sep. 21, 1982, abandoned.

[30] Foreign Application Priority Data

Oct. 2, 1981 [JP] Japan .................................. 56-156961

[51] Int. Cl.$^4$ ........................... G03F 1/00; G03F 3/06
[52] U.S. Cl. ......................................... 430/5; 430/143; 430/145; 430/158; 430/160; 430/166; 430/252; 430/253; 430/258; 430/293; 430/294; 430/301; 430/325; 430/326
[58] Field of Search ............... 430/143, 145, 158, 160, 430/166, 258, 253, 252, 325, 326, 5, 301, 293, 294

[56] References Cited

U.S. PATENT DOCUMENTS

| | | | |
|---|---|---|---|
| 3,067,034 | 12/1962 | Chapman | 430/258 |
| 3,721,557 | 3/1973 | Inoue | 430/166 |
| 4,008,084 | 2/1977 | Ikeda et al. | |
| 4,197,128 | 4/1980 | Watanabe et al. | |
| 4,205,989 | 6/1980 | Moriya et al. | |
| 4,262,079 | 4/1981 | Steelman et al. | 430/253 |
| 4,271,257 | 6/1981 | Wacks et al. | |
| 4,284,703 | 8/1981 | Inoue et al. | |
| 4,307,172 | 12/1981 | Ishihara et al. | |
| 4,388,399 | 6/1983 | Shinozaki et al. | 430/160 |
| 4,389,473 | 6/1983 | Scrutton et al. | 430/258 |

FOREIGN PATENT DOCUMENTS

| | | | |
|---|---|---|---|
| 986773 | 4/1976 | Canada | |
| 1441982 | 7/1976 | United Kingdom | 430/253 |
| 2020837 | 11/1979 | United Kingdom | |
| 2026185 | 1/1980 | United Kingdom | 430/253 |

OTHER PUBLICATIONS

Nakayama et al., *Photo. Sci. & Eng.*, vol. 22, No. 3, 5–6/1980, pp. 138–141.

Primary Examiner—Charles L. Bowers, Jr.
Attorney, Agent, or Firm—Pahl, Lorusso & Loud

[57] ABSTRACT

The present invention relates to a photosensitive masking element for plate making including a support made of a transparent film; a metal thin film layer formed on the support; and a photosensitive masking layer formed on said metal thin film layer and strongly adhering thereto. In preparing masks for various colors, the photosensitive masking material of the present invention makes it unnecessary to fill and retouch ditches corresponding to unnecessary enclosing lines with a correction liquid, resulting in a marked improvement in the efficiency of plate making.

5 Claims, 5 Drawing Figures

PROCESS FOR PREPARATION OF A MASKING ELEMENT FOR FORMING A MULTICOLOR PRINTING PLATE

This is a division of application Ser. No. 420,728 filed Sept. 21, 1982, abandoned.

BACKGROUND OF THE INVENTION

(1) Field of the Invention

This invention relates to a photosensitive element for forming a mask useful to prepare a series of masking plates, each plate for a different color, said plates being used to prepare a printing plate used in multicolor printing.

(2) Description of the Prior Art

When an image is printed not in screen dot but in solid, the prior art has employed a process utilizing a manuscript composed by surrounding the image to be reproduced with a so called enclosing line (said manuscript being hereinafter referred to as "enclosing line manuscript"), wherein the masking plate used for making the printing plate is prepared by subjecting the exposed photosensitive material to a photographic treatment. That is, a negative or positive enclosing line manuscript is printed on a light shielding photosensitive masking layer of the photosensitive material, which is then developed or developed and etched, depending on the type of masking layer. By this photographic treatment, as shown in FIG. 1A, there is formed on a transparent film 2 of a photosensitive material 1, a relief image 6 in the photosensitive masking layer where ditches 5 corresponding to enclosing lines 4 of the manuscript 3 are formed. Next, as shown in FIG. 1B, when the relief image 6 is peeled off from the transparent film 2 with a needle, knife or the like, leaving masking parts 6', there is obtained a masking plate 8 having a desired image as concave parts 7 providing light shielding using the masking plate 8 thus obtained, a similar photographic treatment makes a plate surface.

In the case of multicolor printing, a masking plate for each color is usually prepared by subjecting the relief image which has been obtained from a negative manuscript to selective peeling of areas for a desired color. The negative manuscript contains enclosing lines which are unnecessary for a masking plate for a certain color but required for a masking plate for another color. Since groves (ditches) which are formed upon developing in the photosensitive masking layer corresponding to the enclosing lines do not shield light, it is necessary when preparing the masking plate for each color by selective peeling, that the ditches corresponding to the unnecessary enclosing lines be filled up and retouched by applying on the image a coating liquid with a high light shielding property which is called a correction liquid retouching fluid and drying the retouching fluid applied on the image. The same operation is required for letters, etc. corresponding to a line itself without surrounding them with enclosing lines.

In printing where different colors are butted without superposition, ditches corresponding to enclosing lines give one of the colors and a masking plate for another color is prepared by selective peeling-off after the retouching fluid is coated on the whole surface of the image corresponding to the parts to be butted and then dried to fill up and retouch the ditches.

As the retouching fluid used for such a purpose, both organic solvent types and aqueous solution types are used. In the case of an organic solvent type, care should be taken in its handling because of its inflammability and undesirable odor. The aqueous solution type has some defects such as lower operation efficiency due to its very slow drying.

In addition, a wide flat area and a uniform coating technique are required for coating with retouching fluid, a step begging improvement in the plate making process.

SUMMARY OF THE INVENTION

It is an object of the invention to provide an image forming material, particularly a photosensitive masking material which, in preparing masking plates of various colors, makes it unnecessary to fill or retouch ditches, corresponding to unnecessary enclosing lines, with a correction liquid. In this regard the present invention provides a remarkable improvement in the efficiency of plate making.

Other and further objects, features and advantages of the invention will become more apparent from the following description.

According to the present invention, there is provided an image forming material which is composed of a support made of a transparent film; a thin, light-shielding metal film formed on the support; and a photosensitive masking layer formed as a tough film on the metal thin film layer and strongly adhering thereto.

According to the image forming material of the present invention, when a portion of the negative relief image is peeled off, the underlying metal thin film layer of the same shape is simultaneously peeled off, while leaving on the transparent film the portions of the metal thin film layer corresponding to enclosing lines and letters or the like.

DETAILED DESCRIPTION OF THE PREFERRED EMBODIMENTS

Figure 1A:
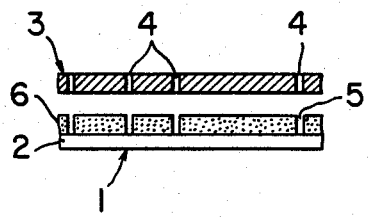
FIGS. 1A and 1B are sectional views showing a process for preparing a masking plate by selectively peeling off a negative relief image of a conventional masking material for plate masking.
Figure 1B:
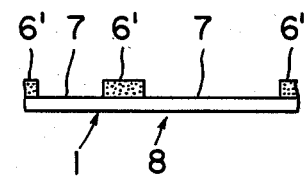
Figure 2:
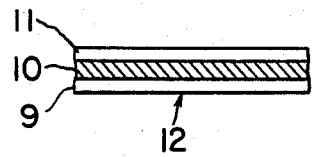
FIG. 2 is a sectional view showing a masking material for plate making according to the present invention.

As shown in FIG. 2, the photosensitive mask forming element of the present invention is composed of a support 9 made of a transparent film; a thin metal film layer 10 formed on said support 9; and a photosensitive masking layer 11 formed as a tough film on said metal thin film layer 10 and strongly adhering thereto.

According to the present invention, there can be used as the support 9, a film forming thermoplastic, high molecular weight compound having a smooth surface on which the metal thin film can be provided. Examples of suitable film-forming thermoplastic high molecular weight compounds are polyester, polycarbonate, polyamide, polypropylene, polyvinyl chloride, polystyrene, polymethyl methacrylate and copolymers thereof as well as diacetyl cellulose, triacetyl cellulose, propyl cellulose and mixed cellulose ester. Particularly preferred is a biaxially oriented polyethylene terephthalate film having excellent dimensional stability.

As the metal which forms the metal thin film layer 10, there can be used any metal which can form a thin film by means of any of the various film forming techniques. The thickness of the metal thin film is preferred to be at least 50 m$\mu$. If it is less than 50 m$\mu$, the light shielding effect thereof is insufficient. The upper limit of the film thickness is 1000 m$\mu$. If it exceeds 1000 m$\mu$, the metal thin film becomes too strong and the resolving power of the image suffers when partially peeled off according to the present invention.

Vacuum plating such as vaporization and sputtering, nonelectrode plating or a combination thereof with electroplating may be used to form the metal film.

The various metals which can be vacuum plated included aluminum, zinc, silver, gold, nickel, cupper, chromium, cobalt, iron and the like. Further, various alloys can be plated by means of sputtering. Cupper, nickel, cobalt, gold, palladium, silver, nickel-cobalt alloy can be plated by means of any known nonelectrode plating.

Generally vacuum plating is superior because of a wide range of usable metals, simplicity and high speed of operation.

In order to vary the adhesiveness between the support and the metal thin film, the support may be subjected to surface treatment. As the surface treatment, there can be utilized corona discharge treatment and alkali etching treatment as well as known treatments such as coating the support with various organic or inorganic substances having a maximum thickness of 2$\mu$.

It is necessary that the photosensitive masking layer 11 have a good film forming property and suitable film strength, because it must support a negative relief image through photographic treatment and then be selectively peeled off. Further the photosensitive masking layer 11 is requred to be strongly adherent to the metal thin film layer 10 so that during peeling-off, the metal thin film can be simultaneously removed from the support.

The photosensitive masking layer may be composed of a single layer of a photosensitive composition comprising a high molecular binder compound and a photosensitizing agent. It may also be a double layered structure in which the lower layer is a layer of a high molecular weight, film-forming binder and the upper layer is a photosensitizing agent.

When the photosensitive masking layer has a double layered structure, the function of the photosensitizing agent is separated from the function of the peelable film. Therefore unlike the photosensitive masking layer having a single layered structure, the double layered embodiment does not require a composition which simultaneously possesses both good peelability and high sensitivity.

As the photosensitive composition, both negative and positive types can be used.

The photosensitive agents suitable for use in the negative type photosensitive compositions include, for example, a condensation product of 4-diazodiphenylamine sulfate and formaldehyde, a condensation product of 4-diazodiphenylamine zinc chloride and formaldehyde, a condensation product of 4-diazodiphenylamine tetrafluoroborate and formaldehyde, and a condensation product of 4-diazodiphenylamine dodecylbenzene sulfonate and formaldehyde. When the photosensitive masking layer is formed with a single layer of photosensitive composition comprising a photosensitizing agent and a high molecular binder compound, the amount of photosensitizing agent based on the high molecular binder compound is from 3 to 50%, preferably from 5 to 30%.

High molecular weight binders which may be used in the negative type photosensitive compositions, include, for example, polyvinyl alcohol, polyacryl amide, polyvinyl pyrrolidone, copolymers of polyvinyl methacrylate and maleic acid, alcohol-soluble polyamide, copolymers of acrylamide and diacetone acrylamide and partially saponified polyvinyl acetate. These high molecular weight compounds are used alone or in combination.

Orthoquinonediazide compounds are useful as the photosensitizing agent in the positive type photosensitive composition. In this case, when the photosensitive masking layer is formed with a single layer photosensitive composition comprising a photosensitizing agent and a high molecular weight binder compound, the amount of the photosensitizing agent based on the high molecular weight binder compound is from 5 to 50%, preferably from 10 to 30%.

Suitable high molecular weight binder compounds which may be used in the positive type photosensitive compositions include, for example, alkali-soluble acryl copolymers, polyvinyl-3-methoxy-4-hydroxybenzal, polyvinyl formal, polyvinyl butyral, polyvinyl acetate and the like. These high molecular weight compounds may be used alone or in combination.

For the film layer in the photosensitive masking layer with a double layered structure, there can be used not only the above mentioned high molecular weight binder compounds but also strong or tough high molecular weight compounds such as alcohol-soluble polyamides such as polycapramide, copolymers of hexamethylene diamine adipate and 4,4'-diaminodicyclohexylmethane adipate, N-methylol derivatives of various polyamides and the like.

Dyes and pigments may be added to the photosensitive composition layer as long as they do not unfavorably influence the phtosensitization mechanism. According to the present invention, light shielding is provided by the thin metal film layer. Therefore dyes and pigments are unnecessary for providing the light shielding. However their addition enables easy confirmation of the state of image, especially whether the edge portions of relief image have been finished sharply.

Described below is the preparation of a masking plate using a photosensitive masking material of the present invention.

As shown in FIG. 2, a photosensitive masking material 12 is composed of a transparent film 9; a metal thin film layer 10 formed on the transparent film 9; and a photosensitive masking layer 11 formed on the metal thin film layer 10.

Figure 3A:
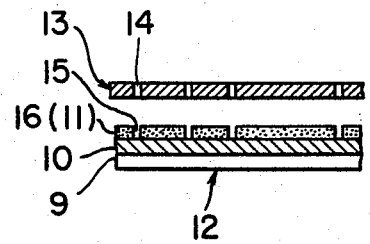
FIGS. 3A and 3B are sectional views showing a process for preparing a masking plate from a masking material for plate making according to the present invention.

As shown in FIG. 3A, when the photosensitive material 12 on which a negtive or positive enclosing line manuscript 13 is placed is exposed to light and developed, exposed and unexposed areas are eluted out depending on the type of the photosensitive masking layer 11. For example, as shown in the Figure, there is formed a negative relief image 16 where the parts corresponding to enclosing lines 14 of the manuscript 13 are ditches 15. When the photosensitive masking layer 11 is composed of a film of a lower layer of high molecular weight compound and an upper layer of a photosensitive composition, both development of the photosensitive composition and etching of the layer of the high molecular weight compound are required.

Figure 3B:
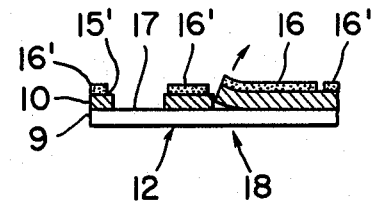

Then as shown in FIG. 3B, when the relief image portion 16 is peeled off, leaving masking parts 16', the lower metal thin film layer 10 of the same shape is simultaneously peeled off to provide a masking plate 18 wherein a desired image is formed as concave parts 17.

During said operation, the parts 15' of metal thin film layer corresponding to enclosing lines 14 of the manuscript 13 are not peeled off and remain on the transparent film 9, because they have no overlay 16 thereon. Therefore when exposed to light, the parts corresponding to enclosing lines are shielded from the light. The enclosing lines 14 of the manuscript 13 include those used for preparing masking plates for other colors. However since they remain as the metal thin film layer, it becomes unnecessary to fill and retouch the ditches with the correction liquid, which operation is indispensable in the conventional process.

Further when, using the same manuscript, a masking plate for another color is prepared from a conventional photosensitive material, the parts of said masking plate corresponding to enclosing lines form ditches which do not shield light. In contrast by combination with the masking plate obtained above using the photosensitive masking material of the present invention, a printing plate is obtained which can be used in printing where different colors are abutted without superposition.

The present invention is further explained by means of the following Examples.

EXAMPLE 1

Ten grams of a completely saponified polyvinyl alcohol with an average polymerization degree of 1700 and 0.5 g of a condensation product of 4-diazodiphenylamine sulfate and formaldehyde were dissolved in 89.5 ml of water to prepare a photosensitive composition solution with a solids content of 10.5%.

Aluminum was vacuum plated on one side of a polyethylene terephthalate film having a thickness of $100\mu$ to form an aluminum thin film layer having a thickness of 100 m$\mu$.

The above mentioned photosensitive composition solution was coated on the aluminum thin film layer with a wire bar in such an amount that the film thickness after drying was $10\mu$, and dried at 90° C. for 3 minutes to form a photosensitive masking layer. Thus an image forming element was obtained.

A positive enclosing line manuscript was brought into contact with the photosensitive masking layer and subjected to light irradiation for 50 seconds with a 2 kW high voltage mercury lamp which was spaced one meter from the manuscript. When the film was developed with flowing water, a negative relief image faithful to the manuscript was obtained on the aluminum thin film layer.

By selectively peeling off the relief image by means of a needle, the parts of the aluminum thin film layer corresponding to the peeled relief image are simultaneously removed while leaving the other parts thereof to provide light shielding areas.

The masking plates for multicolor printing prepared by this method can be directly used for plate making without use of a retouching fluid, greatly simplifying the operation.

EXAMPLE 2

In 89.3 ml of water were dissolved 10 g of a copolymer of acrylamide and diacetone acrylamide (copolymerization ratio of the former:the latter=6:4) having an average polymerization degree of 700 and 0.7 g of a condensation product of 4-diazodiphenylamine zinc chloride and formaldehyde to prepare a photosensitive composition solution with a solids content of 10.7%.

Copper was coated, by sputtering at an argon gas pressure of $5 \times 10^{-3}$ torr, on one side of a polyethylene terephthalate film with a thickness of $100\mu$ to form a copper thin film layer with a film thickness of 100 m$\mu$.

The photosensitive composition solution obtained above was coated on the copper thin film layer with a wire bar in such an amount to provide a film thickness after drying of $10\mu$. After drying for 3 minutes, an image forming element was obtained.

When the image forming element was exposed and developed in the same manner as in Example 1, a negative relief image faithful to a manuscript was obtained on the copper thin film layer. A masking plate obtained by selectively peeling off the relief image can directly be used for plate making without correction.

EXAMPLE 3

In 87 g of 1,2-dichloroethane were dissolved 10 g of polyvinyl formal resin having a formal content of 81%, an acetate content of 9-13% and an alcohol content of 5-6.5% and 3 g of novolak ester of 1,2-naphthoquinonediazide (2)-4-sulfonic acid to prepare a photosensitive composition solution.

Aluminum was vacuum plated on one side of a $100\mu$ thick polyethylene terephthalate film to form a 100 m$\mu$ thick aluminum thin film layer.

The above obtained photosensitive composition solution was coated on the aluminum thin film layer with a wire bar in such an amount that the film thickness after drying became $5\mu$, and dried for 3 minutes to obtain an image forming material.

A negative enclosing line manuscript was brought into contact with the photosensitive masking layer and exposed for 50 seconds by means of the same light source as used in Example 1.

A developing solution was obtained by dissolving 300 g of sodium salicylate and 10 g of sodium hydroxide in 700 ml of water. The above mentioned exposed film was immersed in the developing solution for about 5 minutes.

After water washing and drying, a positive image faithful to the manuscript was formed on the aluminum thin film layer. As in Examples 1 and 2, the photosensitive masking layer is selectively peeled off without use of a retouching fluid to give a masking plate which can be used for plate making.

EXAMPLE 4

In methanol was dissolved a copolymer of caprolactam, hexamethylenediamine adipate and 4,4'-diaminodicyclohexylmethane adipate (commercially available from BASF as ULTRAMID-IC) to prepared a 10% solution of the copolymer in methanol.

The copolymer solution was coated on a 100 m$\mu$ thick aluminum thin film obtained by vacuum plating aluminum on a $100\mu$ thick polyester film. After drying, a copolymer film with a thickness of $10\mu$ was obtained.

On the copolymer film was coated a 20% solution of novolak resin ester of sodium naphthoquinone(1,2)diazide (2)-5-sulfonate in a mixed solvent of methyl ethyl ketone and toluene (1:1) to form a film of photosensitizing agent having a thickness of $3\mu$ after drying.

A film obtained above was contacted with a manuscript and subjected to UV irradiation and alkali development with a aqueous caustic soda solution.

Then the developed film was rubbed in a 20% aqueous solution of neutral salt of p-chloro-benzoic acid to form a relief image on the aluminum layer. When the relief image was selectively peeled off with a knife or the like, the lower aluminum layer was simultaneously peeled off to form a masking plate, which could be used directly for plate making without use of a retouching fluid.

As is clear from the above mentioned Examples, the photosensitive masking material for plate making is prepared by forming the metal thin film layer on the transparent film support and further depositing thereon the photosensitive masking layer with a film-forming property and strong adhesiveness to the metal thin film layer. By selectively peeling off the relief image of the photosensitive masking layer formed by photographic treatment, the metal thin film layer of the same shape as that of the peeled relief image is simultaneously removed while leaving on the transparent film the parts of the light shielding metal thin film layer corresponding to enclosing lines of the manuscript. Therefore in preparing masking plates for various colors, it is unnecessary to fill and retouch the ditches with the retouching fluid, resulting in a marked improvement in the efficiency of plate making.

What is claimed is:

1. A process for preparation of a masking element which is used to prepare a series of masking plates, each plate for a different color, said plates used to prepare a printing plate used in multicolor printing, said process comprising:
    (a) providing a photosensitive element comprising: a transparent film support; a thin film metal layer adhering to the film support; and a photosensitive masking layer comprising a high molecular weight film-forming binder and a photosensitizing agent or a combination of a layer of a high molecular weight film-forming binder with a superimposed layer of a photosensitizing agent, said masking layer adhering to said metal layer, said photosensitive masking layer being liquid developable and capable of forming a relief image, said photosensitive masking layer adhering to the underlying metal film with sufficient strength to remove said metal film from said transparent film when peeled off after development;
    (b) superimposing a line manuscript over the photosensitive masking layer;
    (c) exposing the photosensitive element through said line manuscript:
    (d) liquid developing the exposed element to remove exposed or unexposed areas of the photosensitive masking layer thereby forming a relief image in said photosensitive masking layer while leaving said metal layer intact and;
    (e) peeling off of the film support a selected area or areas of the photosensitive masking layer remaining after development, with adhering metal film of a shape corresponding to that of the selected area or areas, leaving adhered to the film support other areas of the photosensitive masking layer and corresponding, underlaying areas of said metal layer, to produce the masking element.

2. The process of claim 1 wherein a negative relief image is formed and wherein developing bares the metal layer along lines corresponding to those of the line manuscript.

3. The process of claim 1 wherein a positive line manuscript is used in step b and a negative relief image is formed in step d.

4. The process of claim 1 wherein a negative line manuscript is used in step b and a positive relief image is formed in step d.

5. The process of claim 1 wherein said photosensitive element comprises a photosensitive layer comprising a high molecular weight film-forming binder and a photosensitizing agent.

* * * * *

UNITED STATES PATENT AND TRADEMARK OFFICE
CERTIFICATE OF CORRECTION

PATENT NO. : 4,581,308

DATED : April 8, 1986

INVENTOR(S) : Moriya et al

It is certified that error appears in the above-identified patent and that said Letters Patent is hereby corrected as shown below:

Column 1, line 39, "ing using" should read --ing.  Using--.

Column 3, line 15, "cluded" should read --clude-- and "cupper" should read --copper--;

line 17, "Cupper" should read --Copper--; and line 37, "requred" should read --required--.

Column 6, line 58, "prepared" should read --prepare--.

Column 7, line 3, "a" should read --an--.

Signed and Sealed this

Twenty-sixth Day of August 1986

[SEAL]

Attest:

DONALD J. QUIGG

Attesting Officer     Commissioner of Patents and Trademarks